(12) United States Patent
Demsky et al.

(10) Patent No.: US 6,515,550 B2
(45) Date of Patent: Feb. 4, 2003

(54) BIPOLAR RING OSCILLATOR WITH ENHANCED STARTUP AND SHUTDOWN

(75) Inventors: Kevin Paul Demsky, Rochester, MN (US); Randolph B. Heineke, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/852,494

(22) Filed: May 10, 2001

(65) Prior Publication Data

US 2002/0167364 A1 Nov. 14, 2002

(51) Int. Cl.[7] .................................................. H03L 3/00
(52) U.S. Cl. .......................................... 331/57; 331/149
(58) Field of Search ............................ 331/57, 44, 173, 331/34, 149

(56) References Cited

U.S. PATENT DOCUMENTS

| | | |
|---|---|---|
| 5,355,097 A | 10/1994 | Scott et al. |
| 5,519,360 A | 5/1996 | Keeth |
| 5,994,969 A | 11/1999 | Bujanos |

Primary Examiner—Robert Pascal
Assistant Examiner—Kimberly E Glenn
(74) Attorney, Agent, or Firm—Christopher H. Lynt; Joan Pennington

(57) ABSTRACT

A ring oscillator, such as a bipolar ring oscillator with enhanced, fast startup and shutdown includes a series of a plurality of inverting differential stages connected in a loop. The plurality of inverting differential stages includes a first multiplexer stage. The first multiplexer stage includes a first signal input, a second signal input and a select input. An oscillator feedback signal is applied to the first signal input of the first multiplexer stage. A startup circuit is coupled to the first multiplexer stage. The startup circuit includes a differential signal coupled to the second signal input of the first multiplexer stage for starting the bipolar ring oscillator. The startup circuit applies a full differential switching voltage signal to the second signal input of the first multiplexer stage to guarantee start of the bipolar ring oscillator after one delay of the series of the plurality of inverting differential stages connected in the loop. The startup circuit includes a fast transition run signal and a multiplexer select signal responsive to the run signal. The multiplexer select signal is coupled to the select input of the first multiplexer stage for controlling the first multiplexer stage to select the oscillator feedback signal or the static differential signal for stopping the bipolar ring oscillator.

14 Claims, 3 Drawing Sheets

US 6,515,550 B2

BIPOLAR RING OSCILLATOR WITH ENHANCED STARTUP AND SHUTDOWN

FIELD OF THE INVENTION

The present invention relates generally to oscillator circuits, and more particularly, relates to a ring oscillator with enhanced, fast startup and shutdown.

DESCRIPTION OF THE RELATED ART

Ring oscillators are used in a variety of circuits to generate clocking signals. Ring oscillators typically include a series of devices or stages connected together to form a ring with a feedback path provided from the output of a last of the series of devices to an input of a first of the series of devices. The devices may include logic gates, inverters, differential buffers, or differential amplifiers, for example. Any odd number of inverting stages with sufficient gain and offset oscillate when connected in a ring, while an even number of inverting stages simply lock on a particular starting logic level. The ring oscillator is essentially a series of stages, each stage having an intrinsic delay from input to output. The frequency of the ring oscillator output is a function of the total delay time of the series of stages. The steady state frequency of the oscillator is dependent on the intrinsic delay of each of the stages.

FIG. 1 illustrates one known ring oscillator. This prior art ring oscillator of FIG. 1 includes a series of seven differential buffers or differential gain stages connected in a loop, as shown. Each of the buffers is referenced with a voltage source VREF and includes disable and disable bar signal inputs DSBL, DSBLB. Each of the buffers is connected in an inverted configuration.

A problem of typical ring oscillators is noise that is created when switching. It is often desirable to have a ring oscillator that can be disabled, as shown in FIG. 1. When a typical ring oscillator is started after being shut down, the ring oscillator relies on gain and offset, or perhaps noise for oscillator start up. In an ideal case, there is no offset in any of the differential gain stages. Even with gain, if there is no offset on the input of a differential gain stage, no differential voltage appears on the output of a single stage. If there is no switching voltage throughout any of the stages of the ring oscillator, then there is no oscillation.

In the non-ideal case, a small voltage output offset Vo exists in each of the differential gain stages. With a gain A, an input offset Vo is amplified by gain A, and the next stage receives differential voltage A*Vo. With n stages, a last of the n stages receives differential voltage An*Vo. This is the differential voltage that is fed back from the last stage to the first stage in the ring oscillator and is amplified until it reaches the full steady state oscillation switching voltage amplitude and frequency.

Noise also can start the ring oscillator. In general, ring oscillators start if the gain is sufficient and an odd number of inversions exists. However, a problem with typical ring oscillators is the delay in reaching full differential switching voltage and also the delay in reaching steady state oscillation frequency.

A need exists for a bipolar ring oscillator with enhanced, fast startup and shutdown.

SUMMARY OF THE INVENTION

A principal object of the present invention is to provide a ring oscillator with enhanced, fast startup and shutdown. Other important objects of the present invention are to provide such ring oscillator substantially without negative effect; and that.overcome many of the disadvantages of prior art arrangements.

In brief, a ring oscillator with enhanced, fast startup and shutdown is provided. The ring oscillator includes a series of a plurality of inverting stages connected in a loop. The plurality of inverting stages includes a first multiplexer stage. The first multiplexer stage includes a first signal input, a second signal input and a select input. An oscillator feedback signal is applied to the first signal input of the first multiplexer stage. A startup circuit is coupled to the first multiplexer stage. The startup circuit includes a signal coupled to the second signal input of the first multiplexer stage for starting the ring oscillator.

In accordance with features of the invention, in a bipolar ring oscillator the startup circuit applies a full differential switching voltage signal to the second signal input of the first multiplexer stage for starting the bipolar ring oscillator after one delay of the series of the plurality of inverting differential stages connected in the loop. The startup circuit includes a fast transition run signal and a multiplexer select signal responsive to the run signal. The multiplexer select signal is coupled to the select input of the first multiplexer stage for controlling the first multiplexer stage to select the oscillator feedback signal or the static differential signal for stopping the bipolar ring oscillator.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 2:
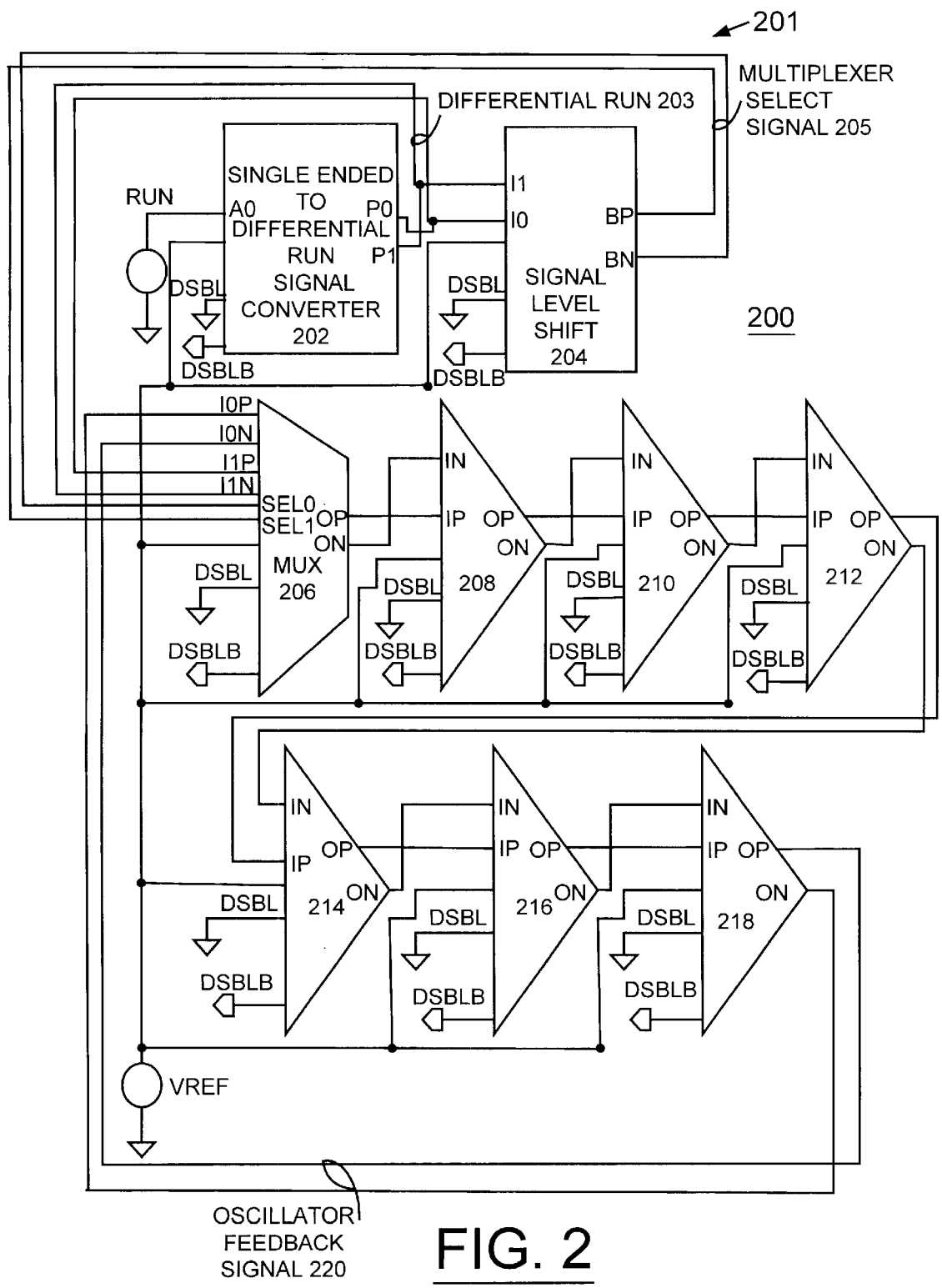
FIG. 2 is a schematic diagram representation illustrating a ring oscillator in accordance with the preferred embodiment.

Having reference now to the drawings, in FIG. 2, there is shown a ring oscillator of the preferred embodiment generally designated by the reference character 200. As shown in FIG. 2, ring oscillator 200 includes an enhanced, fast startup and shutdown circuit of the preferred embodiment generally designated by the reference character 201. Startup and shutdown circuit 201 includes a single ended to differential run signal converter 202. A single ended signal RUN is applied to the single ended to differential run signal converter 202. A differential output signal DIFFERENTIAL RUN 203 of converter 202 is applied to a signal level shift block 204 that is coupled to a multiplexer 206 of the startup and shutdown circuit 201. Signal level shift block 204 provides a downward level shifted DIFFERENTIAL RUN signal output labeled MULTIPLEXER SELECT SIGNAL 205.

Multiplexer 206 forms a first inverting differential stage of the ring oscillator 200. As shown in FIG. 2, ring oscillator 200 includes a series of seven inverting differential buffers or inverting differential gain stages 206, 208, 210, 212, 214, 216, and 218 connected in a loop, as shown. Each of the stages 206, 208, 210, 212, 214, 216, and 218 is referenced with a voltage source VREF. Each of the oscillator stages 206, 208, 210, 212, 214, 216, and 218 optionally includes disable and disable bar signal inputs DSBL, DSBLB that can be used together with the RUN signal when minimizing current flow is desired in addition to stopping oscillation. Each of the oscillator stages 206, 208, 210, 212, 214, 216, and 218, for example, has an identical gain.

Figure 1:
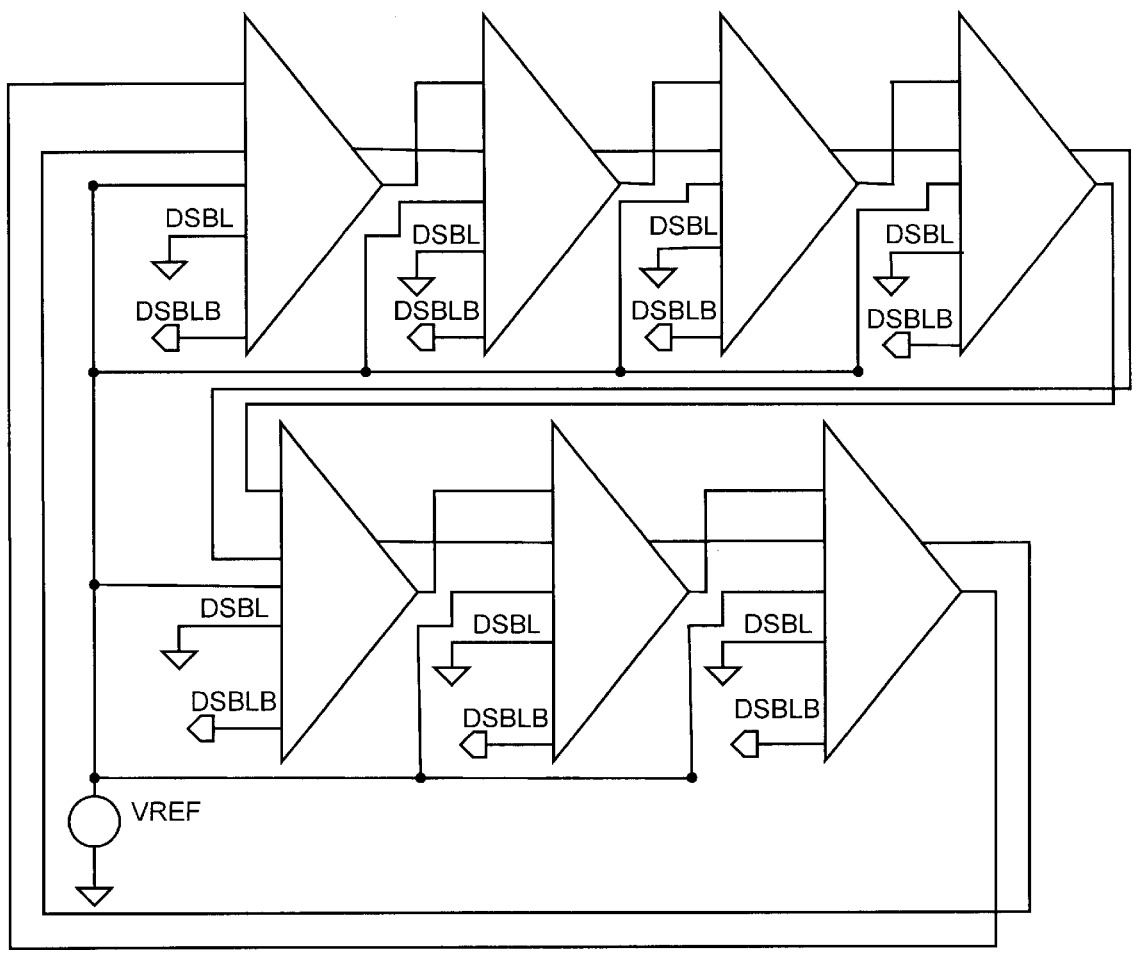
FIG. 1 is a schematic diagram representation illustrating a prior art ring oscillator.

In accordance with features of the preferred embodiment, ring oscillator 200 enables improved, fast startup and shutdown as compared to known ring oscillators, such as the prior art ring oscillator of FIG. 1. In ring oscillator 200, the first stage 206 is enabled to start up in a known state either high or low, with any differential switching voltage or full differential switching voltage, if desired. Ring oscillator 200 also enables fast shutdown.

In ring oscillator 200, an output of the ring oscillator can be taken on the output of the first stage 206 or any of the oscillator stages 206, 208, 210, 212, 214, 216, and 218. Since full differential switching voltage can be applied at the input, ring oscillator 200 is guaranteed to start after one delay of the chain of the oscillator stages 206, 208, 210, 212, 214, 216, and 218 with low stage gain that is greater than one. This is a significant improvement over prior art arrangements.

OSCILLATOR FEEDBACK SIGNAL 220 of oscillator stage 218 is applied to a first input of the multiplexer 206. Output signal DIFFERENTIAL RUN 203 of converter 202 is applied to a second input of the multiplexer 206. MULTIPLEXER SELECT SIGNAL 205 is applied to the multiplexer 206 to select between the signal DIFFERENTIAL RUN 203 and the oscillator feedback signal 220. MULTIPLEXER SELECT SIGNAL 205 controls the multiplexer 206 to select the OSCILLATOR FEEDBACK SIGNAL 220 during a RUN mode of the ring oscillator 200, or a static differential voltage from DIFFERENTIAL RUN 203 during a STOP mode of the ring oscillator 200. Breaking the oscillator feedback path and applying the static differential voltage quickly ends oscillation in the ring oscillator 200. Removing the feedback path to stop the ring oscillator 200 is quicker than removing the VREF to stop current flow.

It should be understood that ring oscillator 200 of the preferred embodiment is not limited to the use of the static differential voltage from DIFFERENTIAL RUN 203 during a STOP mode of the ring oscillator 200.

The polarity of the signal DIFFERENTIAL RUN 203 to the multiplexer 206 controls the polarity of the ring oscillator 200 when the ring oscillator starts.

In operation, the single ended to differential run signal converter 202 converts a single ended RUN signal to the DIFFERENTIAL RUN signal 203. Multiplexer 206 receives at inputs 11P, 11N the DIFFERENTIAL RUN signal 203 output of the single ended to differential run signal converter 202. The signal level shift block 204, such as an emitter follower block shifts the DIFFERENTIAL RUN signal 203 down for the MULTIPLEXER SELECT SIGNAL 205 applied to select inputs SEL0, SEL1 of the multiplexer 206. Based upon the applied MULTIPLEXER SELECT SIGNAL 205, multiplexer 206 selectively outputs a signal to be amplified by the chain of next differential gain stages 208, 210, 212, 214, 216, and 218. Differential gain stage 208 receives at inputs IP, IN from the signal output OP, ON from the multiplexer 206. Each of the next differential gain stages 210, 212, 214, 216, and 218 respectively receives at inputs IP, IN the signal output OP, ON from the signal output OP, ON from the previous differential gain stages 208, 210, 212, 214, and 216. Multiplexer 206 receives at inputs 10P, 10N the signal out OP, ON of differential gain stage 218 labeled OSCILLATOR FEEDBACK SIGNAL 220.

Figure 3:
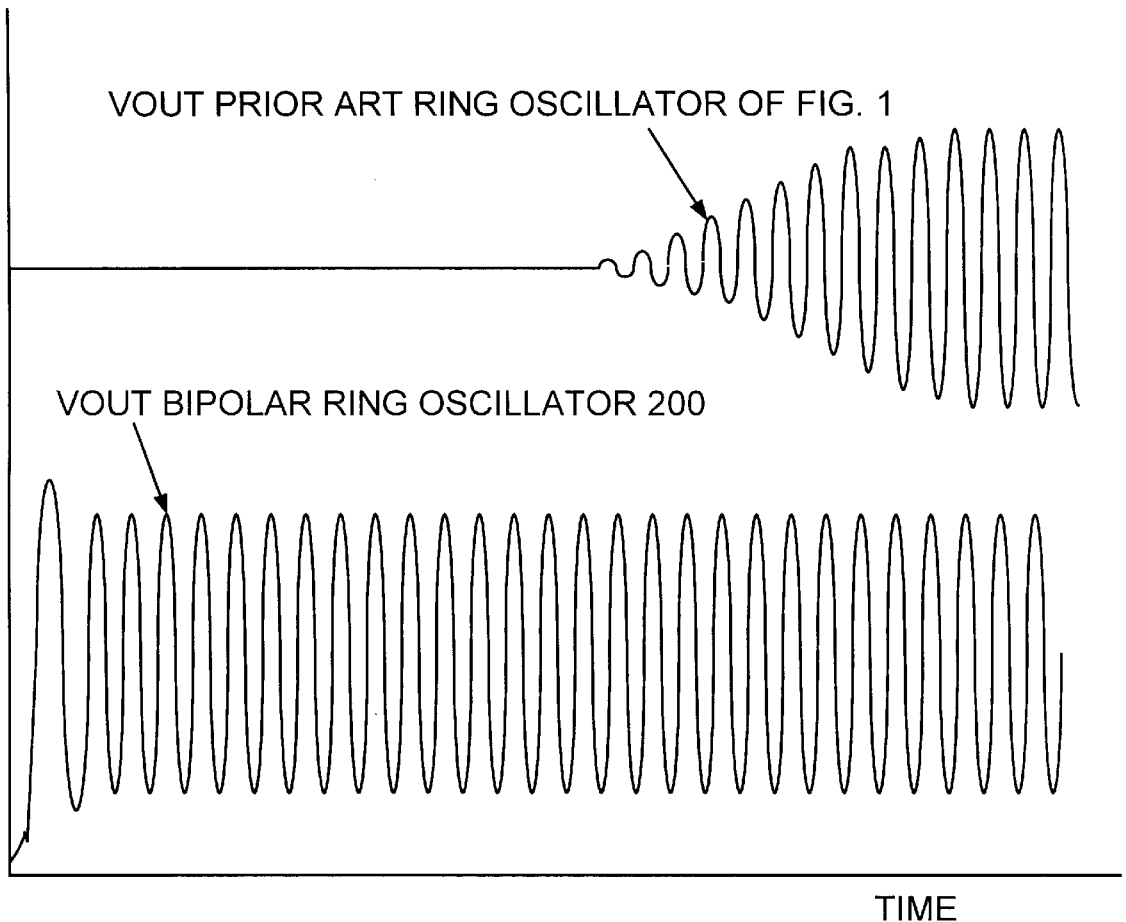
FIG. 3 is a chart illustrating a startup voltage output of the prior art ring oscillator of FIG. 1 for comparison with a startup voltage output of the ring oscillator of FIG. 2 in accordance with the preferred embodiment with time shown with respect to the horizontal axis and voltage shown with respect to the vertical axis.

Referring now to FIG. 3, there is shown a chart illustrating a startup voltage output of the prior art ring oscillator of FIG. 1 for comparison with a startup voltage output of the ring oscillator 200 in accordance with the preferred embodiment with time shown with respect to the horizontal axis and voltage shown with respect to the vertical axis. The output of the prior art ring oscillator of FIG. 1 is shown near the top of the chart and the output of the ring oscillator 200 near the bottom of the chart. A small voltage offset was switched in the prior art ring oscillator of FIG. 1 at 0 nano-seconds (ns), and went to high impedance to kick-start the prior art ring oscillator. With relatively low gain, it takes many cycles through the chain before full oscillation is reached. The delay of a single stage is, for example, about 50 picoseconds (ps), therefore the chain delay is on the order of 350 ps for a seven stage ring oscillator. It takes many times longer than that for the prior art ring oscillator of FIG. 1 to reach full oscillation.

As shown in FIGS. 2 and 3, the ring oscillator 200 includes the same number of stages and the same gain in each stage 206, 208, 210, 212, 214, 216, and 218 as provided for the prior art ring oscillator of FIG. 1. The RUN signal starts rising at 0 ns and ends at a supply voltage VDD in 1 ns. The startup voltage output of the ring oscillator 200 starts with a low differential output and reaches full oscillation before the RUN signal reaches VDD in 1 ns. As shown in FIG. 2, the voltage output of the ring oscillator 200 is taken from the last stage 218 of the ring oscillator. The ring oscillator 200 is powered up and reaches full differential voltage instantly provided by the signal DIFFERENTIAL RUN 203. As shown in FIG. 3, the startup voltage output of the ring oscillator 200 of the preferred embodiment achieves full oscillation frequency and amplitude in a substantially shorter time than the prior art ring oscillator of FIG. 1.

Ring oscillator 200 of the preferred embodiment starts in less time than the period of oscillation provided that the rise of the RUN signal is driven with a relatively fast edge. The polarity of the ring oscillator 200 when the ring oscillator starts with either a low differential output or a high differential output can be selectively controlled by applying a selected polarity of signal DIFFERENTIAL RUN 203 to inputs 11P, 11N of the multiplexer 206.

It should be understood that the ring oscillator 200 of the preferred embodiment is not limited to the illustrated seven stages 206, 208, 210, 212, 214, 216, and 218. Ring oscillator 200 of the preferred embodiment can include any of various selected numbers of stages with an odd number of inversions.

While the present invention has been described with reference to the details of the embodiments of the invention shown in the drawing, these details are not intended to limit the scope of the invention as claimed in the appended claims.

What is claimed is:

1. A ring oscillator comprising:
   a series of a plurality of inverting stages connected in a loop; said plurality of inverting stages including a first multiplexer stage; said first multiplexer stage including a first signal input and a second signal input and a select input; an oscillator feedback signal applied to said first signal input of said first multiplexer stage;

a startup circuit coupled to said first multiplexer stage; said startup circuit including a startup circuit signal coupled to said second signal input of said first multiplexer stage for starting the ring oscillator; said startup circuit including a multiplexer select signal coupled to said select input of said first multiplexer stage for controlling said first multiplexer stage to select said oscillator feedback signal or said startup circuit signal; and said startup circuit including a run signal; said multiplexer select signal being responsive to said run signal for controlling said first multiplexer stage, and said startup circuit signal coupled to said second signal input of said first multiplexer stage being responsive to said run signal for starting the ring oscillator.

2. A ring oscillator as recited in claim 1 wherein said run signal is a relatively fast transition signal and wherein the ring oscillator starts in less time than a period of oscillation of the ring oscillator.

3. A ring oscillator as recited in claim 1 wherein said run signal changes from a first voltage level to a second level voltage in one nano-second.

4. A ring oscillator as recited in claim 1 wherein said multiplexer select signal being responsive to said run signal for controlling said first multiplexer stage for selecting said startup circuit signal coupled to said second signal input of said first multiplexer stage for stopping the ring oscillator.

5. A ring oscillator as recited in claim 1 wherein said startup circuit signal coupled to said second signal input of said first multiplexer stage is responsive to said run signal for starting the ring oscillator in a known state.

6. A ring oscillator as recited in claim 5 wherein said known state includes either a low switching voltage or a high switching voltage.

7. A ring oscillator as recited in claim 1 wherein each of said plurality of said inverting stages includes a voltage reference and disable signals; said disable signals used for current shut off to said plurality of said inverting stages.

8. A ring oscillator as recited in claim 1 wherein said startup circuit signal coupled to said second signal input of said first multiplexer stage for starting the ring oscillator comprises a full switching voltage signal applied to said second signal input of said first multiplexer stage for starting the ring oscillator after one delay of said series of said plurality of inverting stages connected in said loop.

9. A ring oscillator as recited in claim 1 wherein the ring oscillator is a bipolar ring oscillator and wherein said startup circuit includes a converter for converting a single ended run signal to a differential signal coupled to said second signal input of said first multiplexer stage for starting the bipolar ring oscillator.

10. A ring oscillator as recited in claim 9 wherein said startup circuit includes a signal level shift for level shifting said differential signal to provide said multiplexer select signal; said multiplexer select signal coupled to said select input of said first multiplexer stage for controlling said first multiplexer stage to select said oscillator feedback signal or said differential signal.

11. A ring oscillator as recited in claim 9 wherein said series of said plurality of inverting stages connected in said loop includes an odd number of inverting differential stages.

12. A bipolar ring oscillator comprising:

a series of a plurality of inverting differential stages connected in a loop; said plurality of inverting differential.stages including a first multiplexer stage; said first multiplexer stage including a first signal input and a second signal input and a select input; an oscillator feedback signal applied to said first signal input of said first multiplexer stage;

a startup and shutdown circuit coupled to said first multiplexer stage; said startup and shutdown circuit including;

a differential signal applied to said second signal input of said first multiplexer stage for starting the bipolar ring oscillator after one delay of said series of said plurality of inverting differential stages connected in said loop; and a multiplexer select signal coupled to said select input of said first multiplexer stage for controlling said first multiplexer stage to select said oscillator feedback signal or said differential signal for stopping the bipolar ring oscillator.

13. A bipolar ring oscillator as recited in claim 12 wherein said startup and shutdown circuit includes a run signal; said differential signal coupled to said second signal input of said first multiplexer stage is responsive to said run signal for starting the bipolar ring oscillator and said run signal being a fast transition signal, wherein the bipolar ring oscillator starts in less time than a period of oscillation of the bipolar ring oscillator.

14. A method of implementing a ring oscillator comprising the steps of:

providing a series of a plurality of inverting stages connected in a loop with a first multiplexer stage having a first signal input and a second signal input and a select input;

applying an oscillator feedback signal to said first signal input of said first multiplexer stage;

applying a run signal to a second signal input of said first multiplexer stage for starting the ring oscillator after one delay of said series of said plurality of inverting stages connected in said loop; and providing a multiplexer select signal to said select input of said first multiplexer stage for controlling said first multiplexer stage to select said oscillator feedback signal or said run signal for stopping the ring oscillator.

* * * * *